United States Patent
Adetutu et al.

(10) Patent No.: US 7,030,001 B2
(45) Date of Patent: Apr. 18, 2006

(54) METHOD FOR FORMING A GATE ELECTRODE HAVING A METAL

(75) Inventors: Olubunmi O. Adetutu, Austin, TX (US); Lynne M. Michaelson, Austin, TX (US); Kathleen C. Yu, Austin, TX (US); Robert E. Jones, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/827,202

(22) Filed: Apr. 19, 2004

(65) Prior Publication Data

US 2005/0233562 A1    Oct. 20, 2005

(51) Int. Cl.
*H01L 21/3205* (2006.01)

(52) U.S. Cl. ............... 438/585; 438/677; 438/674

(58) Field of Classification Search ............ 438/677, 438/587, 674, 585
See application file for complete search history.

(56) References Cited

U.S. PATENT DOCUMENTS

| | | | |
|---|---|---|---|
| 5,358,743 A | 10/1994 | Hampden-Smith et al. | |
| 5,725,788 A | 3/1998 | Maracas et al. | |
| 5,869,135 A | 2/1999 | Vaeth et al. | |
| 5,937,758 A | 8/1999 | Maracas et al. | |
| 5,959,337 A * | 9/1999 | Gardner et al. | 257/410 |
| 6,228,723 B1 * | 5/2001 | Kim | 438/283 |
| 6,605,534 B1 | 8/2003 | Chung et al. | |
| 6,649,211 B1 | 11/2003 | Lyons et al. | |
| 6,686,282 B1 * | 2/2004 | Simpson et al. | 438/685 |
| 2003/0148618 A1 | 8/2003 | Parikh | |
| 2003/0162316 A1 | 8/2003 | Zangmeister et al. | |
| 2003/0181035 A1 | 9/2003 | Yoon et al. | |
| 2004/0121614 A1 * | 6/2004 | Baek et al. | 438/743 |
| 2004/0140513 A1 | 7/2004 | Forbes et al. | |
| 2004/0198009 A1 * | 10/2004 | Chen et al. | 438/303 |
| 2004/0213971 A1 * | 10/2004 | Colburn et al. | 428/209 |
| 2005/0045923 A1 * | 3/2005 | Chambers | 257/288 |
| 2005/0048722 A1 * | 3/2005 | Saito et al. | 438/275 |

FOREIGN PATENT DOCUMENTS

JP    63-299280    * 12/1988

* cited by examiner

*Primary Examiner*—Caridad Everhart
(74) *Attorney, Agent, or Firm*—Joanna G. Chiu; David G. Dolezal

(57) ABSTRACT

One embodiment forms a gate dielectric layer over a substrate and then selectively deposits a first metal layer over portions of the gate dielectric layer in which a first device type will be formed. A second metal layer, different from the first metal layer, is formed over exposed portions of the gate dielectric layer in which a second device type will be formed. Each of the first and second device types will have different work functions because each will include a different metal in direct contact with the gate dielectric. In one embodiment, the selective deposition of the first metal layer is performed by ALD and with the use of an inhibitor layer which is selectively formed over the gate dielectric layer such that the first metal layer may be selectively deposited on only those portions of the gate dielectric layer which are not covered by the inhibitor layer.

38 Claims, 4 Drawing Sheets

METHOD FOR FORMING A GATE ELECTRODE HAVING A METAL

FIELD OF THE INVENTION

The present invention relates generally to semiconductor processing, and more specifically, to forming gate electrodes having a metal which may be used, for example, in dual metal gate integration.

RELATED ART

As semiconductor technology continues to evolve, the sizes of semiconductor devices are becoming increasingly smaller and thus scalability of devices is a desirable feature. To achieve appropriate scalability, the threshold voltages have to be adjusted accordingly. However, with polysilicon gates, it is difficult or impossible to achieve the appropriate adjustment of threshold voltages while maintaining the required drive currents. Therefore, the industry has begun to look at the use of metals rather than polysilicon to accommodate the desired threshold voltage levels of scaled devices. Having a metal directly on the gate dielectric within a gate electrode stack of a device allows for improved work function characteristics. That is, the use of different metals in direct contact with the gate dielectric results in different work functions. Therefore, both PMOS and NMOS devices, which require gate electrodes having different work functions, may be formed using different metals in contact with the respective gate dielectrics. However, problems arise in achieving this dual metal gate integration.

For example, in one approach for achieving dual metal gate integration known today, a first metal layer is blanket deposited on the gate dielectric (where this first metal layer may be used to form a metal-containing gate electrode stack of a first type of device, such as, for example, a PMOS device). However, this first metal layer then needs to be removed from portions of the gate dielectric which will be used to form a second type of device, such as, for example, an NMOS device, which requires a different metal layer in contact with the gate dielectric within its metal-containing gate electrode stack. Therefore, after removal of the first metal layer from portions of the gate dielectric layer, a second metal layer may be formed (where this second metal layer may be used to form a metal-containing gate electrode stack of the second type of device.)

In this prior art solution, portions of the first metal layer are removed by either a dry or wet etch using traditional photolithographic techniques. However, this deposition and subsequent etching of the first metal layer from portions of the gate dielectric introduces many problems which result in poorer devices. For example, the etching may underetch the first metal layer, thus leaving behind residual material from the first metal layer on the gate dielectric which will negatively affect the work function of the resulting device. Alternatively, the subsequent etching of the first metal layer may result in overetching into the underlying gate dielectric which undesirably reduces the thickness of the gate dielectric in the regions in which the second metal electrode is formed.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As described above, it is desirable to be able to form transistors having a metal-containing gate electrode where a metal layer of the metal-containing gate electrode is in direct contact with an underlying gate dielectric. This may allow, for example, for improved scalability and improved work function characteristics. Furthermore, different types of devices (such as, for example, PMOS and NMOS devices) typically require different metal layers to be in contact with the underlying gate dielectric within their respective gate electrode stacks in order to provide the desired work functions. Therefore, one embodiment of the present invention forms a gate dielectric layer and then selectively deposits a first metal layer over portions of the gate dielectric layer in which devices will be formed using the first metal layer. After selective deposition of the first metal layer, a second metal layer, different from the first metal layer, may be formed over the remaining exposed portions of the gate dielectric layer in which devices will be formed using the second metal layer. In one embodiment, the selective deposition of the first metal layer is performed with the use of an inhibitor layer which is selectively formed over the gate dielectric layer such that the first metal layer may be selectively deposited on only those portions of the gate dielectric layer which are not covered by the inhibitor layer. Embodiments of the present invention will be described in more detail in reference to FIGS. 1–8 below.

Figure 1:
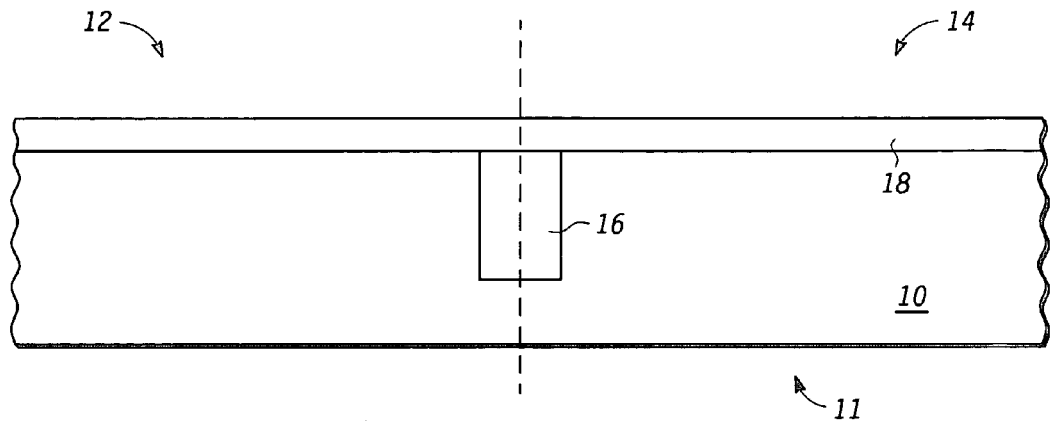
FIG. 1 illustrates a cross-sectional view of a substrate having a gate dielectric layer overlying the substrate, in accordance with one embodiment of the present invention.

FIG. 1 illustrates a semiconductor structure 11 in accordance with one embodiment of the present invention. Note that, in one embodiment, semiconductor 11 may be a portion of a semiconductor wafer. Semiconductor structure 11 of FIG. 1 includes a substrate 10 having an isolation region 16 and a gate dielectric layer 18 overlying substrate 10 and isolation region 16. Note that in an alternate embodiment, gate dielectric layer 18 may not overlie isolation region 16. Semiconductor structure 11 of FIG. 1 is divided into two regions: a first device region 12 and a second device region 14. Device regions 12 and 14 define regions of substrate 10 in which different types of devices will be formed. For example, in one embodiment, device region 12 corresponds to an NMOS device region in which NMOS devices will be formed, and device region 14 corresponds to a PMOS device region in which PMOS devices will be formed. However, note that in alternate embodiments, device region 12 may correspond to a PMOS device region and device region 14 may correspond to an NMOS device region. In yet other alternate embodiments, device regions 12 and 14 may be any type of regions in which different devices will be formed. Also, note that semiconductor structure 11 may include any number of device regions, as needed, in which different types of devices will be formed.

In one embodiment, substrate 10 is a semiconductor substrate, such as, for example, a silicon substrate, gallium arsenide substrate, silicon germanium substrate, germanium substrate, etc. In one embodiment, substrate 10 includes a bulk substrate, but in alternate embodiments, substrate 10 may include a silicon-on-insulator (SOI) substrate having any type of semiconductor material (such as, for example, silicon, gallium arsenide, silicon germanium, germanium, etc.) overlying an insulator, such as, for example, a buried oxide. Gate dielectric layer 18 may include any type of gate dielectric material, such as, for example, hafnium oxide, hafnium silicate, zirconium silicate, zirconium oxide, tantalum oxide, titanium oxide, nitrided silicon dioxide, etc. Gate dielectric layer 18 may be formed using conventional techniques. In the illustrated embodiment, note that gate dielectric layer 18 is formed over both regions 12 and 14; however, in alternate embodiments, each of regions 12 and 14 may include a different type of gate dielectric material such that a first gate dielectric layer overlies substrate 10 in region 12 and a second gate dielectric layer, different from the first gate dielectric layer, overlies substrate 10 in region 14. Also note that substrate 10 may also include well implants (not shown) as needed for the formation of devices. These well implants may be formed using conventional implanting techniques as known in the art.

Figure 2:
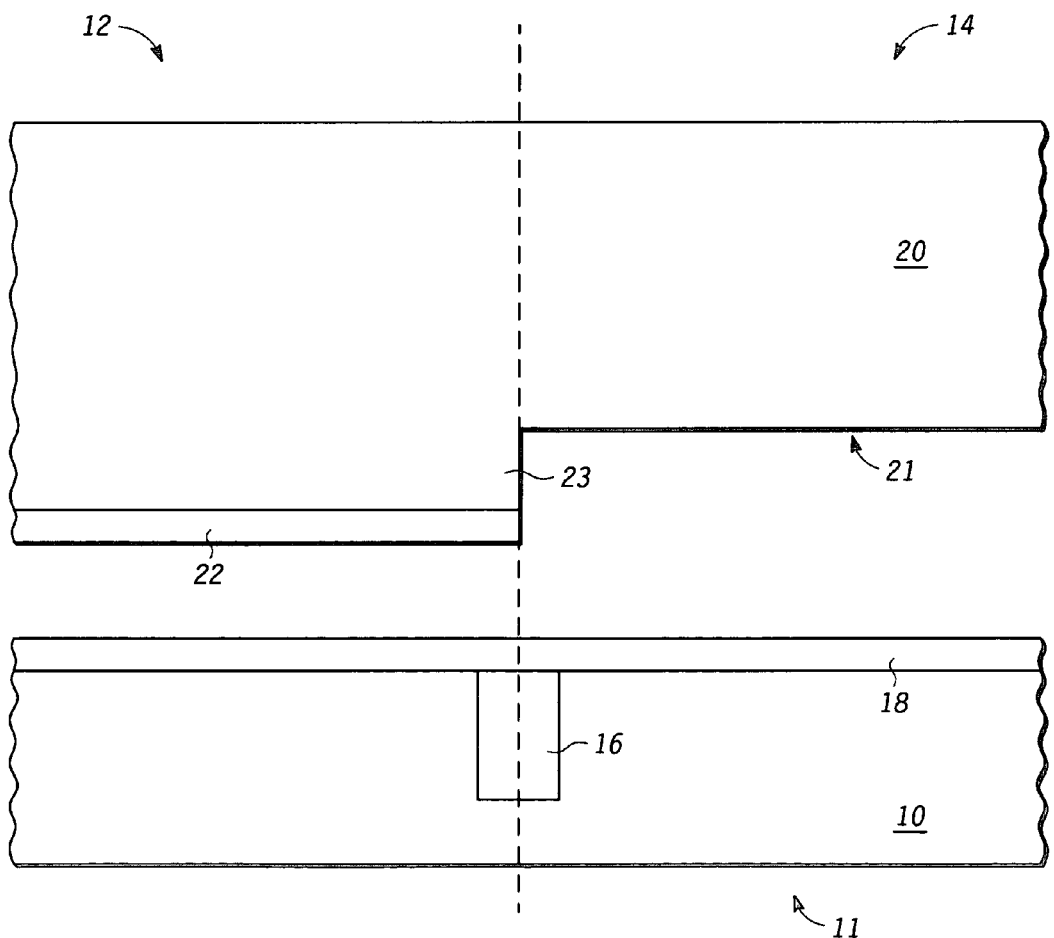
FIG. 2 illustrates a cross-sectional view of the substrate of FIG. 1 and a stamp mask aligned over the substrate, in accordance with one embodiment of the present invention.

FIG. 2 illustrates semiconductor structure 11 with a stamp mask 20 aligned over substrate 10. Stamp mask 20 includes an inhibitor material 22 overlying a proud portion 23 of stamp mask 20 which extends beyond a surface 21 of stamp mask 20. The proud portion or portions of stamp mask 20 correspond to those portions which, when stamped onto a surface of a substrate, contact the substrate while the remaining portions of stamp mask 20 (those which are not proud) do not contact the surface of the substrate. Therefore, the material on the proud portions will be stamped or printed onto the surface of the substrate upon contact. In one embodiment, stamp mask 20 is formed of an elastomeric material.

Therefore, referring to FIG. 2, stamp mask 20 includes proud portion 23 which, when appropriately aligned with substrate 10, corresponds to device region 12 of semiconductor structure 11 such that, when applied, inhibitor material 22 will be applied to region 12 but not region 14. Note that inhibitor material 22 may be placed in a variety ways onto proud portion 23 of stamp mask 20. For example, in one embodiment, stamp mask 20 may be dipped into a dish of inhibitor material, such that only the proud portions of stamp mask 20 contact the inhibitor material (in this manner, the remaining surface, such as surface 21, does not receive any inhibitor material). Alternatively, the inhibitor material may be applied to stamp mask 20 using, for example, a roller that transfers the inhibitor material to the proud portions of stamp mask 20 without transferring the inhibitor material to the remaining surface of stamp mask 20, such as surface 21.

Figure 3:
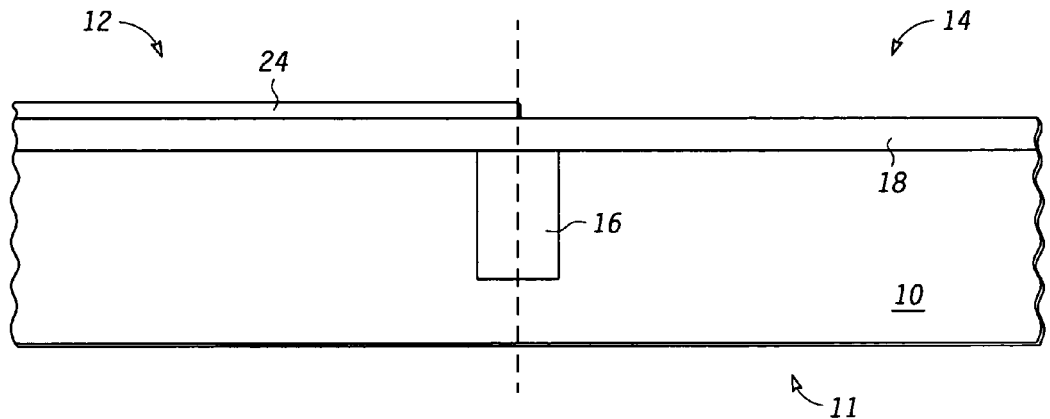
FIG. 3 illustrates a cross-sectional view of the substrate of FIG. 2 after application of the stamp mask and a resulting inhibitor layer formed over a region of the substrate, in accordance with one embodiment of the present invention.

FIG. 3 illustrates semiconductor structure 11 after stamping with stamp mask 20. That is, stamp mask 20 is applied to semiconductor structure 11 such that proud portion 23 (but not surface 21) contacts gate dielectric layer 18. After lifting of stamp mask 20, note that all or a portion of inhibitor material 22 remains over gate dielectric layer 18 in region 12, thus forming inhibitor layer 24 over gate dielectric layer 18 within region 12 but not within region 14 of semiconductor structure 11. That is, the use of stamp mask 20 allows for inhibitor layer 24 to be selectively formed over portions of gate dielectric layer 18 (where, for example, these portions correspond to region 12 of FIG. 3). In one embodiment, inhibitor layer 24 includes a methyl group, such as, for example, organosilanes and self assembled monolayers (SAMs). Also, in one embodiment, inhibitor layer 24 may include any number and type of materials so long as it includes a surface portion or layer which includes a methyl group. In one embodiment, sufficient inhibitor material 22 is used to ensure that inhibitor layer 24 formed over gate dielectric 18 is sufficiently thick to cover all nucleation sites of region 12 with at least a monolayer of inhibitor material. In an alternate embodiment, inhibitor layer 24 may be selectively formed over portions of gate dielectric layer 18 through traditional photolithographic techniques. In another alternate embodiment, inhibitor layer 24 is a photo definable polymer. In this embodiment, the photo definable polymer may be a methacrylate based polymer.

Figure 4:
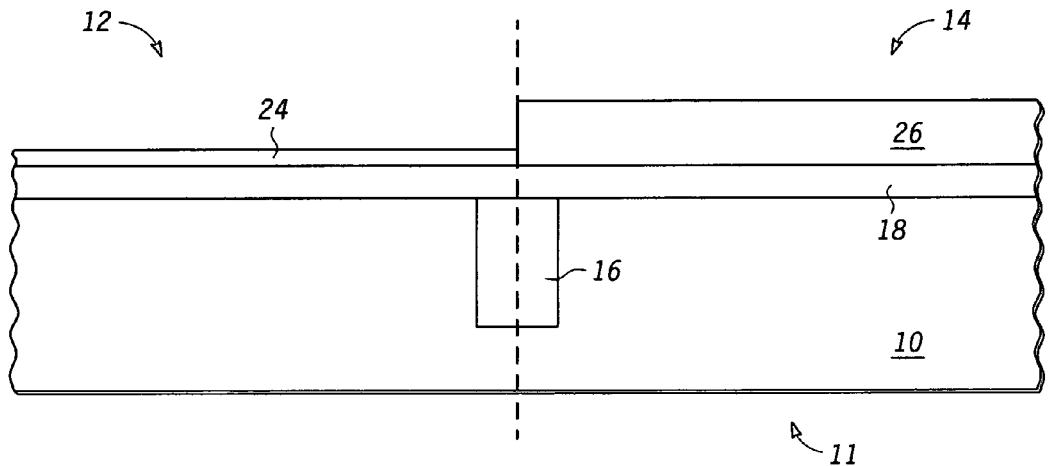
FIG. 4 illustrates a cross-sectional view of the substrate of FIG. 3 after selective deposition of a first metal layer, in accordance with one embodiment of the present invention.

FIG. 4 illustrates semiconductor structure 11 after formation of a first metal layer 26 overlying gate dielectric layer 18 in region 14. As illustrated in FIG. 4, first metal layer 26 is selectively deposited onto gate dielectric layer 18 using, for example, atomic layer deposition (ALD). Inhibitor layer 24 prevents the formation of first metal layer 26 on gate dielectric layer 18 within region 12. Therefore, note that first metal layer 26 is in direct contact with gate dielectric layer 18 within region 14 but is not formed in those places where inhibitor layer 24 is formed. This is because inhibitor layer 24 covers (and blocks) the nucleation sites of gate dielectric layer 18 within region 12, thus inhibiting the formation (e.g. deposition) of a metal layer within region 12 during the ALD formation of first metal layer 26. Note that in alternate embodiments, a selective chemical vapor deposition (CVD) process may be used to form first metal layer 26 in region 14. With selective CVD, inhibitor layer 24 also prevents the formation of first metal layer 26 within region 12 since inhibitor layer 24 blocks nucleation sites.

Figure 5:
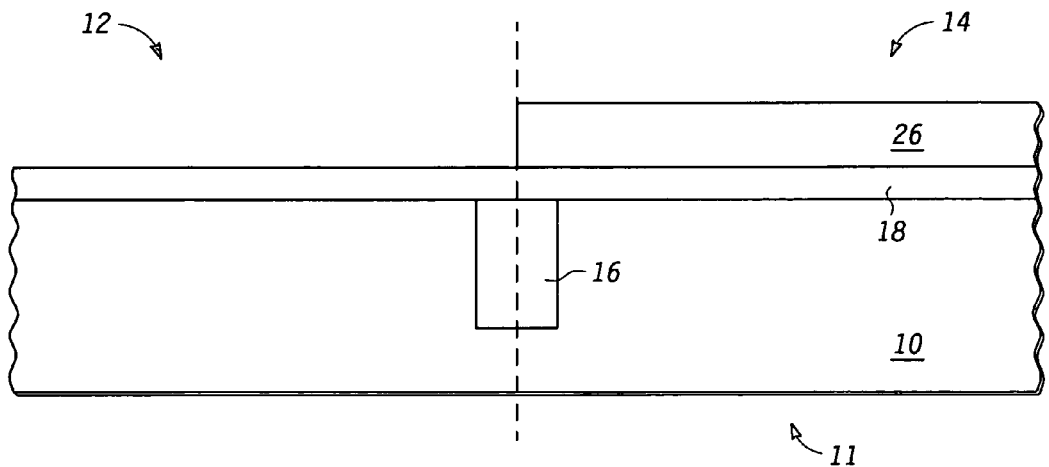
FIG. 5 illustrates a cross-sectional view of the substrate of FIG. 4 after removal of the inhibitor layer, in accordance with one embodiment of the present invention.

FIG. 5 illustrates semiconductor structure 11 after removal or neutralization of inhibitor layer 24. In one embodiment, inhibitor layer 24 is removed using an anneal process. For example, an anneal at a temperature of at least 100 degrees Celsius, or, alternatively, in a range of about 100 to 900 degrees Celsius, may be used. This anneal causes inhibitor layer 24 to desorb or sublimate. Alternatively, other methods may be used to remove inhibitor layer 24, such as, for example, plasma treating, plasma etching, or ultra violet (UV) irradiation.

Figure 6:
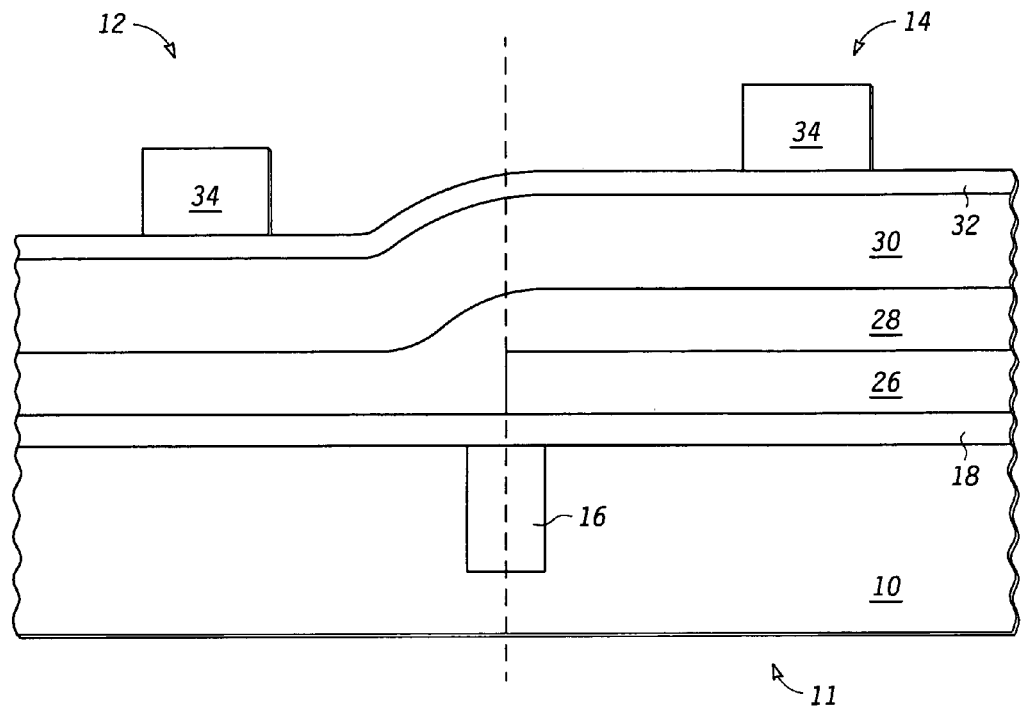
FIG. 6 illustrates a cross-sectional view of the substrate of FIG. 5 after formation of a second metal-containing gate layer, a polysilicon gate layer, an antireflective coating (ARC) layer, and a patterned masking layer in accordance with one embodiment of the present invention.

FIG. 6 illustrates semiconductor structure 11 after formation of a second metal layer 28 over exposed portions of gate dielectric 18 and first metal layer 26. In one embodiment, second metal layer 28 is formed by a blanket deposition. However, alternate embodiments may form second metal layer 28 differently. For example, in an alternate embodiment, second metal layer 28 may be formed such that it is formed over exposed portions of gate dielectric layer 18 (e.g. within region 12) and over none or only a portion of first metal layer 26 in region 14. Note that second metal layer 28 is in direct contact with gate dielectric layer 18 in region 12. Therefore, in region 12, second metal layer 28 is in direct contact with gate dielectric layer 18, and in region 14, first metal layer 26 is in direct contact with gate dielectric layer 18. This will therefore allow for different work functions for devices formed in each of regions 12 and 14.

Still referring to FIG. 6, after formation of second metal layer 28, a polysilicon gate layer 30 (also referred to as polycrystalline silicon gate layer 30) is formed overlying second metal layer 28. After formation of polysilicon gate layer 30, an antireflective coating (ARC) layer is formed overlying polysilicon gate layer 30. Note that in alternate embodiments, more, fewer, or different layers may be formed over second metal layer 28. For example, any number of different layers may be used instead of or in addition to polysilicon layer 30. Also, note that ARC layer 32 is optional, depending on the subsequent photolithography processes used. After formation of polysilicon gate layer 30 and ARC layer 32 (or any other layers desired over second metal-containing gate layer 28), a patterned masking layer 34 is formed overlying ARC layer 30 (where patterned masking layer 34 may be formed using conventional processes). In the illustrated embodiment, patterned masking layer 34 defines a gate electrode stack of a first device in region 12 and a gate electrode stack of a second device in region 14. Note that in alternate embodiments, patterned masking layer 34 may be used to define any number of gate stacks depending on the number of devices desired. Also note that in an alternate embodiment, polysilicon layer 30 and ARC layer 32 may not be present such that patterned masking layer 34 is formed directly over second metal-containing layer 28. In yet another alternate embodiment, where second metal-containing layer 28 is not formed over first metal layer 26, patterned masking layer 34 may be formed directly over second metal layer 28 in region 12 and first metal layer 26 in region 14.

In the illustrated embodiment, the gate electrode stack defined by patterned masking layer 34 in region 12 corresponds to a PMOS type gate electrode stack and the gate electrode stack defined by patterned masking layer 34 in region 14 corresponds to an NMOS type gate electrode stack. Therefore, in one embodiment, first metal layer 26 may include, for example, titanium nitride, iridium, iridium oxide, ruthenium, ruthenium oxide, tantalum nitride, etc., and second metal layer 28 may include, for example, tantalum silicon nitride, tantalum carbide, a metal boride, a metal silicon nitride, a metal carbide, etc. However, note that in alternate embodiments, different metals or combination of metals may be used within first metal layer 26 and second metal layer 28 depending on the devices being formed. For example, the gate electrode stack defined by patterned masking layer 34 in region 12 may correspond to an NMOS device and the gate electrode stack defined by patterned masking layer 34 in region 14 may correspond to a PMOS device, and the materials of the first and second metal layers may be selected accordingly. In one embodiment, the thicknesses of first metal layer 26 and second metal layer 28 range between approximately 30 Angstroms to 500 Angstroms.

Figure 7:
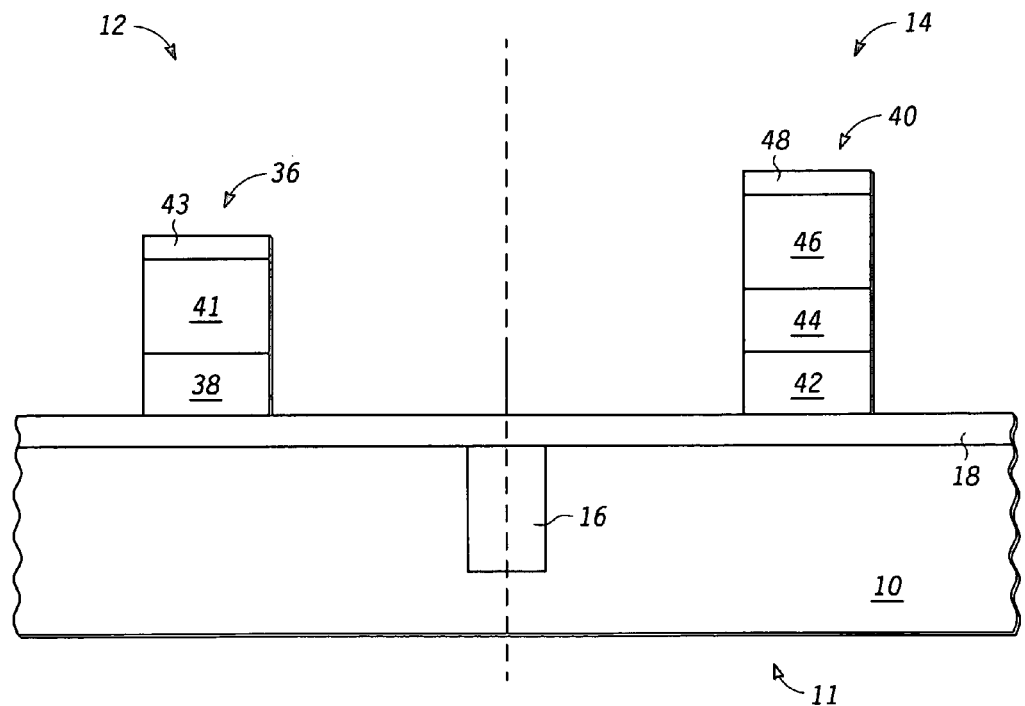
FIG. 7 illustrates a cross-sectional view of the substrate of FIG. 6 after formation of gate electrode stacks using the patterned masking layer and after removal of the patterned masking layer, in accordance with one embodiment of the present invention.

FIG. 7 illustrates semiconductor structure 11 after formation of gate electrode stack 36 overlying gate dielectric layer 18 in region 12 and gate electrode stack 40 overlying gate dielectric layer 18 in region 14. Therefore, after formation of patterned masking layer 34, conventional etch processes may be used to form gate electrode stacks 36 and 40. Patterned masking layer 34 is then removed. As illustrated in FIG. 7, gate electrode stack 36 includes a first metal layer 38 formed from second metal layer 28, a polysilicon gate layer 41 formed from polysilicon gate layer 30, and an ARC layer 43 formed from ARC layer 32. Gate electrode stack 40 includes a first metal layer 42 formed from first metal layer 26, a second metal layer 44 formed from second metal layer 28, a polysilicon gate layer 46 formed from polysilicon gate layer 30, and an ARC layer 48 formed from ARC layer 32. Therefore, note that each of gate electrode stacks 36 and 40 include different metal layers (38 and 42, respectively) in direct contact with gate dielectric layer 18 in regions 12 and 14, respectively, thus resulting in different work functions. (Note that layers 38, 41, 43, 42, 44, 46, and 48 may also be referred to as structures 38, 41, 43, 42, 44, 46, and 48, respectively.)

Note that in alternate embodiments, gate electrode stacks 36 and 40 may include any number of layers, where the illustrated embodiment provides just one example of gate stacks 36 and 40. For example, in one embodiment, each of gate electrode stacks 36 and 40 may include a single gate layer (such as, for example, gate layer 38 and gate layer 42, without gate layers 41, 43, 44, 46, and 48) or each of gate electrode layers 36 and 40 may include any number of gate layers. Alternatively, other types of gate electrode stacks may be formed.

Figure 8:
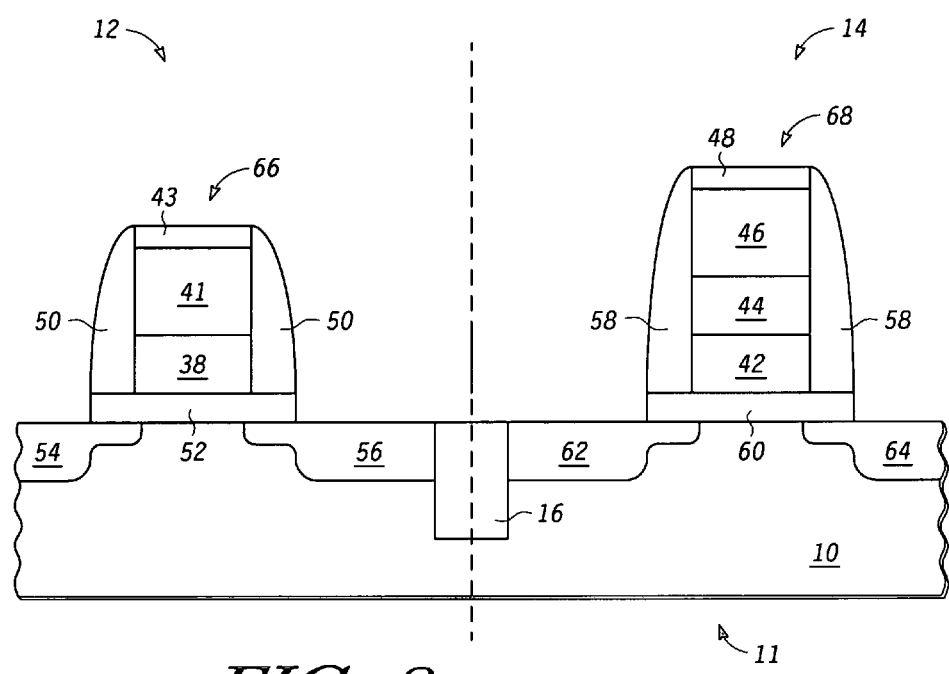
FIG. 8 illustrates a cross-sectional view of the substrate of FIG. 7 after formation of two substantially completed devices within different regions of the substrate, in accordance with one embodiment of the present invention.

FIG. 8 illustrates semiconductor structure 11 after formation of substantially completed device 66 in region 12 and device 68 in region 14 where the subsequent processing may be performed using conventional techniques. (Note that devices 66 and 68 may be referred to as transistors 66 and 68.) Device 66 includes sidewall spacers 50 adjacent sidewalls of gate electrode stack 36 and source/drain regions 54 and 56 extending laterally within substrate 10 and underlying portions of gate dielectric 52 (formed from gate dielectric layer 18). Note that spacers 50 and source/drain regions 54 and 56 may be formed using conventional processes. For example, spacers 50 may include a single material or may include multiple materials. In the illustrated embodiment, source/drain regions 54 and 56 include extension regions and deep implant regions; however, in alternate embodiments, different types of source/drain regions may be formed. Device 68 in region 14 includes sidewall spacers 58 adjacent sidewalls of gate electrode stack 40 and source/drain regions 62 and 64 extending laterally within substrate 10 and underlying portions of gate dielectric 60 (formed from gate dielectric layer 18). Note that spacers 58 and source/drain regions 62 and 64 may be formed using conventional processes. For example, spacers 58 may include a single material or may include multiple materials. In the illustrated embodiment, source/drain regions 62 and 64 include extension regions and deep implant regions; however, in alternate embodiments, different types of source/drain regions may be formed. In alternate embodiments, devices 66 and 68 may be formed having different resulting structures using different methods than those illustrated and described in reference to FIG. 8, while still using the selective deposition of first metal layer 26 described above.

Therefore, it can be appreciated how the selective formation of first metal layer 26 through the use of inhibitor layer 24 (which may be selectively formed) allows for dual metal gate integration while avoiding the problems presented by prior art methods. That is, unlike the prior art solutions described above, the selective formation of first metal layer 26 may prevent the need to etch away portions of a metal-containing gate layer overlying gate dielectric layer 18. This may prevent the dangers of overetching gate dielectric layer 18. Also, without the need to etch away portion of a metal layer, the danger of having residual material from the metal layer due to the etching of the metal layer may also be avoided. Therefore, the embodiments described herein may allow for improved dual metal gate integration where devices requiring different metals in direct contact with the gate dielectric layer may be formed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of making transistors, the method comprising:
   selectively depositing a first metal layer on a gate dielectric of a first region of a wafer and not on a gate dielectric of a second region of the wafer;
   depositing a second metal layer over the gate dielectric of the second region;
   forming a first gate electrode stack for a first transistor in the first region, the first gate electrode stack including a structure formed from the first metal layer;
   forming a second gate electrode stack for a second transistor in the second region, the second gate electrode stack including a structure formed from the second metal layer,
   wherein the method further comprises:
   forming an inhibitor on the gate dielectric of the second region, wherein the inhibitor inhibits the deposition of the first metal layer on the gate dielectric of the second region.

2. The method of clam 1 wherein the first transistor is a PMOS transistor and the second transistor is an NMOS transistor.

3. The method of claim 1 wherein the first transistor is an NMOS transistor and the second transistor is a PMOS transistor.

4. The method of claim 1 wherein:
   the depositing the second metal layer further comprises depositing the second metal layer over the fast metal layer in the first region;
   wherein the first gate electrode stack includes a structure formed from the second metal layer over the first metal layer.

5. The method of claim 1 wherein the inhibitor inhibits by blocking nucleation sites on the gate dielectric of the second region.

6. The method of claim 1 wherein the inhibitor is characterized as a self assembling monolayer.

7. The method of claim 1 wherein the inhibitor includes an organosilane.

8. The method of claim 1 wherein the inhibitor includes a methyl group.

9. The method of claim 1 wherein the inhibitor includes a methacrylate based polymer.

10. The method of claim 1 wherein the inhibitor includes a photodefinable polymer.

11. The method of claim 1 wherein the first metal layer includes one of tantalum silicon nitride, tantalum carbide, a metal boride, a metal silicon nitride, and a metal carbide.

12. The method of claim 1 wherein the first metal layer includes one of titanium nitride, iridium, iridium oxide, ruthenium, ruthenium oxide, and tantalum nitride.

13. The method of claim 1 wherein the first metal layer is selectively deposited using an atomic layer deposition (ALD) process.

14. The method of claim 1 wherein the first metal layer is selectively deposited using a chemical vapor deposition (CVD) process.

15. The method of claim 1 further comprising:
   forming a polysilicon layer over the first metal layer in the first region and a polysilicon layer over the second metal layer in the second region;
   wherein the first gate electrode stack includes a structure formed from the polysilicon layer over the first metal layer in the first region;
   wherein the second gate electrode stack includes a structure formed from the polysilicon layer over the second metal layer in the second region.

16. The method of claim 1 wherein the first metal layer has a first work function and the second metal layer has a second work function, die first work function is different from the second work function.

17. The method of claim 1 wherein the forming an inhibitor further comprises:
   selectively forming the inhibitor on the gate dielectric of the second region and not on the gate dielectric of the first region.

18. The method of claim 17 wherein the selectively forming the inhibitor includes forming the inhibitor by stamping.

19. The method of claim 18 wherein the selectively forming the inhibitor includes applying material of the inhibitor by print stamping.

20. The method of claim 19 wherein the applying material of the inhibitor by print stamping includes stamping the wafer with a stamp mask having a layer of inhibitor material at a location on the mask corresponding to the second region.

21. The method of claim 20 wherein the location on the mask is a proud portion of the mask.

22. The method of claim 1 further comprising:
   neutralizing the inhibitor after the depositing the first metal layer and prior to the depositing the second metal layer.

23. The method of claim 22 wherein the neutralizing the inhibitor includes removing the inhibitor.

24. The method of claim 22 wherein the neutralizing the inhibitor further includes heating the wafer at 100 C or greater.

25. The method of claim 22 wherein the neutralizing the inhibitor further includes plasma treating the inhibitor.

26. The method of claim 22 wherein the neutralizing the inhibitor further includes plasma etching the inhibitor.

27. The method of claim 22 wherein the neutralizing the inhibitor further includes irradiating the inhibitor with ultra violet (UV) radiation.

28. A method of making a transistor, the method comprising:
   selectively forming an inhibitor on a dielectric in a first region of a wafer and not on a dielectric of a second region of the wafer;
   selectively depositing a metal layer on the dielectric of the second region, wherein the inhibitor inhibits the deposition of the metal layer on the dielectric of the first region;
   forming a gate electrode stack for a transistor in the second region, the gate electrode stack including a structure formed from the metal layer.

29. The method of claim 28 further comprising:
   neutralizing the inhibitor after the depositing the metal layer and prior to the forming the gate electrode stack.

30. The method of claim 28 wherein the inhibitor includes a methyl group.

31. The method of claim 28 wherein the inhibitor includes an organosilane.

32. The method of claim 28 wherein the inhibitor is characterized as a self assembling monolayer.

33. The method of claim 28 wherein the selectively farming the inhibitor includes fanning the inhibitor by stamping.

34. The method of claim 28 wherein the selectively fanning the inhibitor includes applying material of the inhibitor by print stamping.

35. The method of claim 28 further comprising:
   depositing a second metal layer on a dielectric of the first region;
   forming a second gate electrode stack for a second transistor in the first region of the wafer, the second gate electrode stack including a structure formed from the second metal layer.

36. The method of claim 35 further comprising:
   neutralizing the inhibitor after the depositing the metal layer and prior to the depositing the second metal layer.

37. A method of making transistors, the method comprising:
   selectively forming an inhibitor an a gate dielectric in a first region of a wafer and not on a gate dielectric in a second region of the wafer;
   selectively depositing using an atomic layer deposition process, a first metal layer on the gate dielectric of the second region while inhibiting the deposition of the first metal layer on the gate dielectric of the first region;
   depositing a second metal layer over the gate dielectric of the first region;
   forming a first gate electrode stack for a first transistor in the first region, the first gate electrode stack including a structure fanned from the second metal layer;
   forming a second gate electrode stack for a second transistor in the second region, the second gate electrode stack including a structure formed from the first metal layer.

38. The method of claim 37 further comprising:
   forming source/drain regions for the first transistor and the second transistor.

* * * * *

UNITED STATES PATENT AND TRADEMARK OFFICE
CERTIFICATE OF CORRECTION

PATENT NO. : 7,030,001 B2 Page 1 of 1
APPLICATION NO. : 10/827202
DATED : April 18, 2006
INVENTOR(S) : Olubunmi O. Adetutu et al.

It is certified that error appears in the above-identified patent and that said Letters Patent is hereby corrected as shown below:

Column 10, Line 2, Claim No. 34:

Change "fanning" to --forming--

Signed and Sealed this

Third Day of June, 2008

JON W. DUDAS
*Director of the United States Patent and Trademark Office*